US011282780B2

(12) United States Patent
Cheah et al.

(10) Patent No.: US 11,282,780 B2
(45) Date of Patent: Mar. 22, 2022

(54) INTEGRATED BRIDGE FOR DIE-TO-DIE INTERCONNECTS

(71) Applicant: Intel Corporation, Santa Clara, CA (US)

(72) Inventors: Bok Eng Cheah, Bukit Gambir (MY); Jenny Shio Yin Ong, Bayan Lepas (MY); Seok Ling Lim, Kulim (MY); Kooi Chi Ooi, Glugor (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/025,115

(22) Filed: Sep. 18, 2020

(65) Prior Publication Data
US 2021/0193567 A1    Jun. 24, 2021

(30) Foreign Application Priority Data
Dec. 20, 2019    (MY) .............................. PI2019007653

(51) Int. Cl.
| H01L 23/538 | (2006.01) |
| H01L 25/065 | (2006.01) |
| H01L 23/522 | (2006.01) |
| H01L 23/528 | (2006.01) |
| H01L 23/50 | (2006.01) |
| H01L 23/498 | (2006.01) |
| H01G 4/12 | (2006.01) |
| H01L 49/02 | (2006.01) |

(52) U.S. Cl.
CPC ....... *H01L 23/5223* (2013.01); *H01G 4/1272* (2013.01); *H01L 23/5286* (2013.01); *H01L 23/5381* (2013.01); *H01L 23/5385* (2013.01); *H01L 23/5386* (2013.01); *H01L 28/60* (2013.01)

(58) Field of Classification Search
CPC ............. H01L 23/5381; H01L 23/5386; H01L 25/0655
See application file for complete search history.

(56) References Cited

U.S. PATENT DOCUMENTS

| 10,535,608 | B1* | 1/2020 | Rubin ................. H01L 23/5381 |
| 2017/0330835 | A1* | 11/2017 | Deshpande ......... H01L 23/5381 |
| 2019/0295952 | A1* | 9/2019 | Sikka .................. H01L 23/5381 |
| 2021/0159211 | A1* | 5/2021 | Rubin ................. H01L 23/5385 |

\* cited by examiner

*Primary Examiner* — Omar F Mojaddedi
(74) *Attorney, Agent, or Firm* — Schwegman Lundberg & Woessner, P.A.

(57) ABSTRACT

An electronic device and associated methods are disclosed. In one example, the electronic device can include a semiconductor package including a package substrate, a first semiconductor die on the package substrate, a second semiconductor die on the package substrate, a third semiconductor die on the package substrate, and a bridge interconnect at least partially embedded in the package substrate. The bridge interconnect can include a first bridge section coupling the first semiconductor die to the second semiconductor die, a second bridge section coupling the second semiconductor die to the third semiconductor die, and a power-ground section between the first section and the second section, the power-ground section comprising first and second conductive traces coupled to the second semiconductor die.

12 Claims, 8 Drawing Sheets

FIG. 5 under a footprint of a more centrally located semiconductor die. It is desired to have semiconductor package configurations that address these concerns, and other technical challenges.

INTEGRATED BRIDGE FOR DIE-TO-DIE INTERCONNECTS

This application claims the benefit of priority to Malaysian Application Serial No. PI2019007653, filed Dec. 20, 2019, which is incorporated herein by reference in its entirety.

TECHNICAL FIELD

Embodiments described herein generally relate semiconductor package geometries including bridges between multiple semiconductor dies.

BACKGROUND

In semiconductor packaging, power lines are often interrupted when additional components are embedded under a footprint of a more centrally located semiconductor die. It is desired to have semiconductor package configurations that address these concerns, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The systems and methods disclosed herein can address power integrity challenges associated with semiconductor package layouts. For example, undesired AC loop inductance between a silicon device and power delivery network can induce increased power supply noise induced jitter (PSIJ). Similarly, impedance load-line performance can be impacted where reference planes within the package have discontinuities. These power integrity challenges can occur, for example, in multi-chip packages with embedded bridge component that requiring high density coupling between each of the multiple dies.

Disclosed herein are semiconductor packages with multiple dies, using an integrated bridge component to couple those dies to each other. The integrated bridge can contain a middle power-ground section so as to not interrupt connection of power-ground network to the central die, and allow for reference planes without major discontinuities. The middle power-ground section can isolate two outer sections that include traces connecting the first die to the second die, and the second die to the third die, respectively. The design can allow for improved power integrity performance of a multi-chip package by reduced AC loop inductance, and improve impedance load-line performance.

Figure 1A:
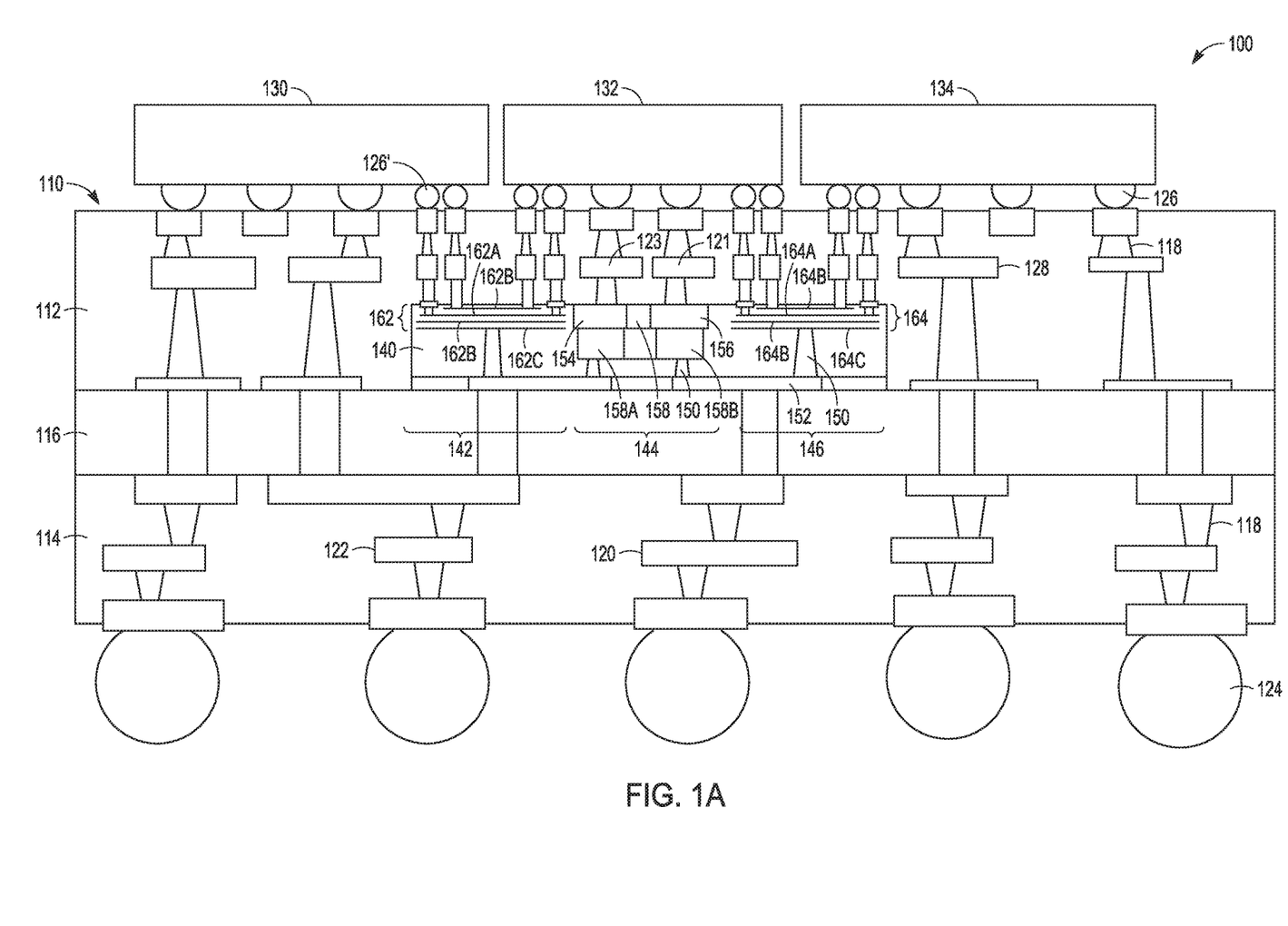
FIGS. 1A-1B are a schematic diagrams of a multi-chip package with an integrated bridge component including an embedded capacitor, in accordance with some example embodiments.
Figure 1B:
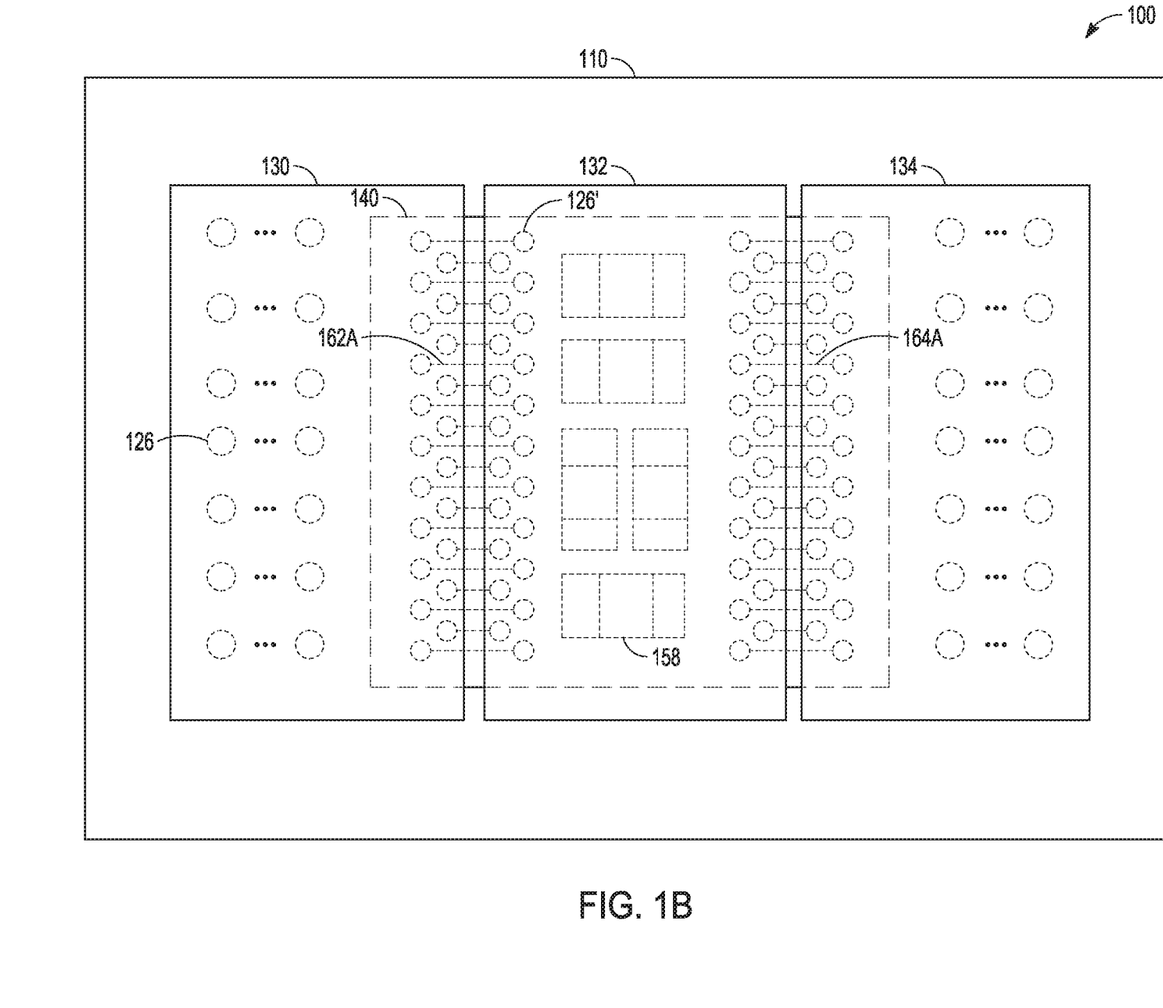

FIGS. 1A-1B are schematic diagrams of a multi-chip package 100 with an integrated bridge component 140 including an embedded capacitor 158. Package 100 can be a multi-chip semiconductor package assembly, with an integrated bridge component for improved power integrity. FIG. 1A is a cross-sectional schematic view, while FIG. 1B is a top-down schematic view. FIGS. 1A and 1B will be discussed together.

Package 100 can include, for example, substrate 110 with first side 112, second side 114, and core layer 116, via 118, power ($V_{CC}$) supply trace 120, ground ($V_{ss}$) trace 122, solder ball 124, solder bumps 126, 126', signal trace 128, semiconductor dies 130, 132, 134, bridge component 140 with sections 142, 144, 146, landside via 150, landside plane 152, conductive traces 154, 156, capacitor 158, and bridge substrate material 160.

In package 100, semiconductor dies 130, 132, 134, can rest on and be coupled to first side 112 of package substrate 110. Dies 130, 132, 134, can be electrically coupled to other components and/or each other through components embedded in package 110, such as via 118, traces 120, 122, signal trace 128 and bridge component 140. Bridge component 140 can include, for example, substrate material 160 defining side sections 142, 146, with middle section 144 in between. Capacitor 158 can be, for example, embedded in bridge component 140 in middle section 144.

Substrate 110 can be, for example, a semiconductor package substrate hosting one or more semiconductor dies such as dies 130, 132, 134. Package substrate 110 can have first side 112 opposite second side 114, separated by a dielectric or core layer 116. Package substrate 110 can be connected to semiconductor dies 130, 132, 134 through via 118 and signal trace 128. In other arrangements, package substrate 110 can be a coreless substrate, for example, without core layer 116. Via 118 and signal trace 128, can allow for electrical connection from semiconductor dies 130, 132, 134 through package substrate 110 to a circuit board, and/or to other components mounted on package 110 or on the circuit board.

Power trace 120 can be connected to a power supply reference voltage ($V_{CC}$) for assembly 100. Power trace 120 can include conductive traces, contact pads, via, or other conductive pathways to allow coupling of the reference power voltage ($V_{CC}$) to one or more of semiconductor dies 130, 132, 134. In some cases, power trace 120 can be coupled to one or more power planes receiving the power supply voltage ($V_{CC}$), for example, from a circuit board (not shown) through solder ball 124.

Ground trace 122 can be connected to a ground reference voltage ($V_{ss}$) for assembly 100. Ground trace 122 can include conductive traces, contact pads, via, or other conductive pathways to allow coupling of the reference ground voltage ($V_{ss}$) to one or more of semiconductor dies 130, 132, 134. In some cases, ground trace 122 can be coupled to one or more ground planes receiving the ground voltage ($V_{ss}$), for example, from the circuit board (not shown) through solder ball 124.

Solder ball 124, can be, for example, ball grid arrays (BGA) made of conductive solder in an appropriate pattern to create electrical connections. Solder ball 124 can be on second side 114 of package 110, for connecting package 110 to a circuit board or other component (not shown). Solder bumps 126, 126' can be on first side 112 of package 110, for connecting package 110 to dies 130, 132, 134. Solder ball 124 and solder bumps 126, 126', can be connected to traces, via, contact pads, or combinations thereof, made of a conductive material, to allow for electrical connection to or through package 110, dies 130, 132, 134, or other components. Solder ball 124 and solder bumps 126, 126' can be underfilled with an appropriate adhesive, such as, for example, epoxy or another adhesive as known in the art.

Semiconductor dies 130, 132, 134, can be mounted on package substrate 110. Dies 130, 132, 134, can be, for example, a central processing unit (CPU), a platform controller hub/chipset die (PCH), a graphic processing unit (GPU), a memory die, a field programmable gate array (FGPA) or another semiconductor die. Semiconductor dies 130, 132, 134, can be coupled to first side 112 of package substrate 110 through a plurality of solder bumps or other interconnects 126, 126'. Semiconductor dies 130, 132, 134, can be coupled to each other, to power trace 120, to ground trace 122, or combinations thereof, through bridge component 140.

Bridge component 140 can allow for connections between first, second, and third semiconductor dies 130, 132, 134. Bridge component 140 can be embedded, for example, in first side 112 of package 110, between core layer 116 and dies 130, 132, 134.

Bridge component 140 can be made of a substrate material 160, forming the shaped of the bridge component. The substrate material 160 can be, for example, a material that hosts traces, via, contact pads, passive components, or other components inside the bridge component 140. The substrate material 160 can be, for example, a silicon, glass, or ceramic substrate. In some cases, the bridge component 140 can additionally include a molded frame on, with, or adjacent the substrate. The molded frame can be, for example, an organic material such as a thermoset, a thermoplastic material, such as an epoxy resin polymer, or other molding compound.

Bridge component 140 can include three sections: first side section 142, closest to semiconductor die 130, middle section 144 in the central portion of the bridge component 140, and second side section 146, closest to semiconductor die 134. The middle section 144 can physically and electrically isolate the first side section 142 from the second side section 146.

First side section 142 can include an electrical routing layer 162. Electrical routing layer 162 can include one or more metallic layers, for example, electrical signal routing layer 162A, ground ($V_{SS}$) reference plane 162B and power ($V_{CC}$) reference plane 162C. First die 130 is coupled to second die 132, for example, through electrical signal routing layer 162A.

Second side section 146 can include an electrical routing layer 164. Electrical routing layer 164 can include one or more metallic layers, for example, electrical signal routing layer 164A, ground ($V_{SS}$) reference plane 164B and power ($V_{CC}$) reference plane 164C. Second die 132 is coupled to third die 134, for example, through electrical signal routing layer 164A.

Landside via 150, landside plane 152, conductive traces 154, 156, and capacitor 158, can be at least partially embedded in the bridge component 140 and run through one or more of the sections 142, 144, 146, to create various power-ground connections between semiconductor dies 130, 132, 134, and other components.

The power ($V_{CC}$) plane 121 and ground ($V_{ss}$) plane 123 can run through the middle section 144 in first side 112 of package 110, to allow connection of power ($V_{CC}$) trace 120 and ground ($V_{ss}$) trace 122 to central semiconductor die 132. The power ($V_{CC}$) plane 121 and ground ($V_{ss}$) plane 123 can run parallel each other, and be isolated from each other by dielectric material.

Capacitor 158 can be, for example, a decoupling capacitor partially embedded in the bridge component 140. For example, capacitor 158 can be a multi-layer ceramic capacitor (MLCC), or a silicon capacitor. In some cases, capacitor 158 can be embedded in middle section 144 of bridge component 140. In some examples, a different or additional type of passive component can be partially or fully embedded in bridge component 140.

Capacitor 158 can, for example, include first terminal 158A and second terminal 158B. First terminal 158A can be coupled to ground ($V_{ss}$) trace 122, while second terminal 158B can be coupled to power ($V_{CC}$) trace 120. Capacitor 158 can be coupled to traces 120, 122 in second side 114 of package 110, through, for example, landside via 150 and landside plane 152. In some cases, capacitor 158 can be coupled to traces or reference planes in the electrical routing layers 162, 164 through landside via 150 extending through the surface of the bridge component 140. In some cases, through silicon via (TSV) can be used. In some cases, capacitor 158 can be coupled to one or more of semiconductor dies 130, 132, 134, for example, through conductive traces 154, 156, power ($V_{CC}$) plane 121 and ground ($V_{ss}$) plane 123.

Integrated bridge 140, with embedded capacitor 158, can allow for improved power integrity in multi-chip semiconductor package 100. Coupling of middle semiconductor die 132 through middle section 144 to power ($V_{CC}$) trace 120 and ground ($V_{ss}$) trace 122 can prevent longer, more extensive pathways that could result in worse power integrity.

Figure 2A:
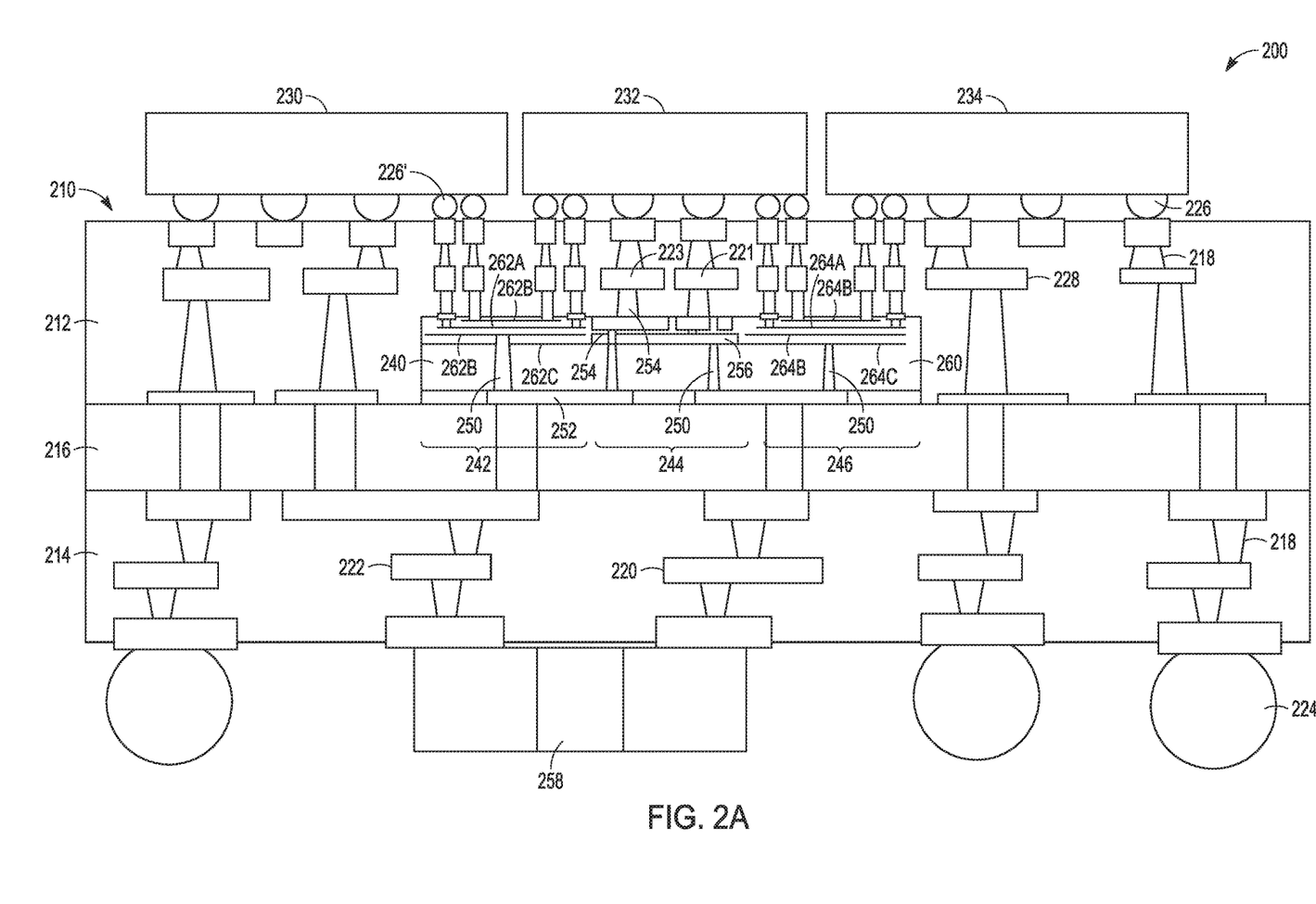
FIG. 2A-2B are a schematic diagrams of a multi-chip package with an integrated bridge component including modified electrical traces, in accordance with some example embodiments.
Figure 2B:
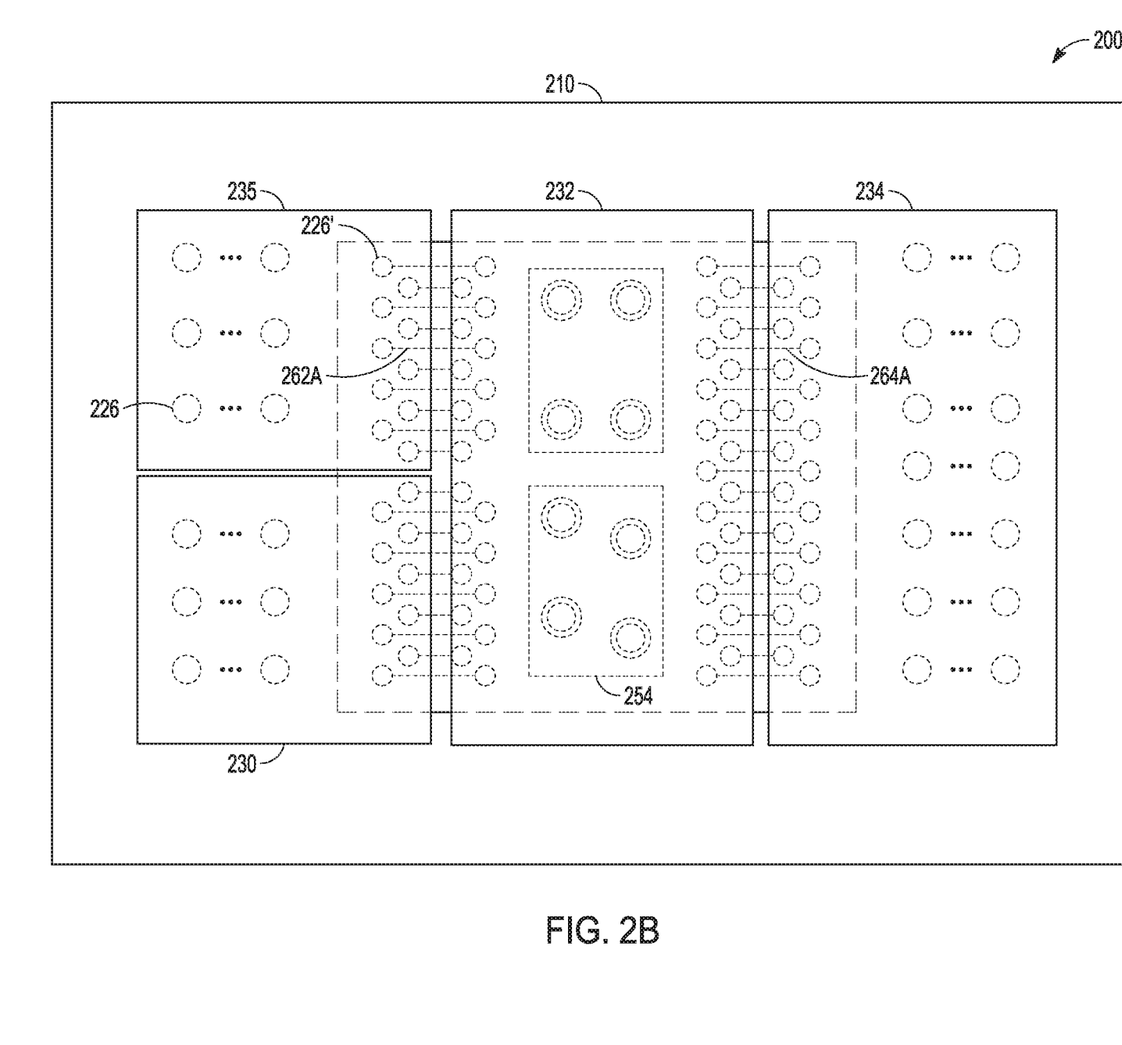

FIG. 2A-2B are schematic diagrams of a multi-chip package 200 with an integrated bridge component 240. FIG. 2A is a cross-sectional schematic view, while FIG. 2B is a top-down schematic view. FIGS. 2A and 2B will be discussed together.

Package 200 can include, for example, substrate 210 with first side 212, second side 214, and core layer 216, via 218, power ($V_{CC}$) trace 220, power ($V_{CC}$) plane 221, ground ($V_{ss}$) trace 222, ground ($V_{ss}$) plane 223, solder ball 224, solder bumps 226, 226', semiconductor dies 230, 232, 234, 235 bridge component 240 with sections 242, 244, 246, landside via 250, landside plane 252, conductive traces 254, 256, capacitor 258, and bridge substrate material 260. The components in package 200 are similar to the corresponding components in package 100, except where otherwise noted.

In package 200, semiconductor dies 230, 232, 234, can rest on and be coupled to first side 212 of package substrate 210. Dies 230, 232, 234, can be electrically coupled to other components and/or each other through components embedded in package 210, such as via 218, traces 220, 222, signal trace 228 and bridge component 240. Bridge component 240 can include, for example, substrate material 260 defining side sections 242, 246, with middle section 244 in between. Landside via 250, landside plane 252, conductive traces 254, 256, can be embedded in bridge component 240 substrate 260. Capacitor 258 can be, for example, on surface 214 of package substrate 210, opposite semiconductor dies 230, 232, 234, 235.

In bridge component 240, conductive traces 254, 256, in addition to landside via 250 and landside plane 252, can couple the power-ground connections of dies 230, 232, 234, 235, to each other, to power ($V_{CC}$) trace 220, ground ($V_{ss}$) trace 222, other components, or combinations thereof.

Conductive traces 254, 256, embedded in the bridge component 240, can be parallel each other, and stacked in the middle section 244. In some cases, conductive trace 254 can include a central ground (Vss) plane 254. In some cases, conductive trace 256 can include a central power (Vcc) plane. Central ground (Vss) plane 254 and central power ($V_{CC}$) plane 256 can be stacked in an alternating fashion within the middle section 244 of the bridge component 240. Central ground (Vss) plane 254 and central power ($V_{CC}$) plane 256 can be coupled, for example, to second semiconductor die 232, and to other traces, via, or contact pads on or near the bridge component 240. Central ground (Vss) plane 254, central power ($V_{CC}$) plane 256 can, for example, have a thickness greater than other reference planes in the bridge component 240, for example, reference planes or traces present inside sections 242, 246, of the bridge component 240. In some cases, central ground (Vss) plane 254 and central power ($V_{CC}$) plane 256 are coupled to the reference planes present inside sections 242, 246 of the bridge component 240, for example through landside via 250 and landside plane 252.

Capacitor 258 can be disposed on surface 214, the landside surface, of package substrate 210. Capacitor 258 can be coupled to the bridge component 240, for example, central ground (Vss) plane 254 and central power (Vcc) plane 256 through via 218, traces 220, 222, or other planes, for reduced AC loop inductance between capacitor 258 and semiconductor dies 230, 232, 234, 235. In some cases, capacitor 258 can be coupled to the reference planes present inside sections 242, 246, of the bridge component 240, for example, ground (Vss) reference planes 162B, 164B and power (Vcc) reference planes 162C, 164C.

In some cases, first die 230 is coupled to second die 232 through electrical signal routing 262A (similar to electrical signal routing 162A in FIGS. 1A and 1B). In some cases, second die 232 is coupled to third die 234 through electrical signal routing 264A (similar to electrical signal routing 164A in FIGS. 1A and 1B.

Figure 3:
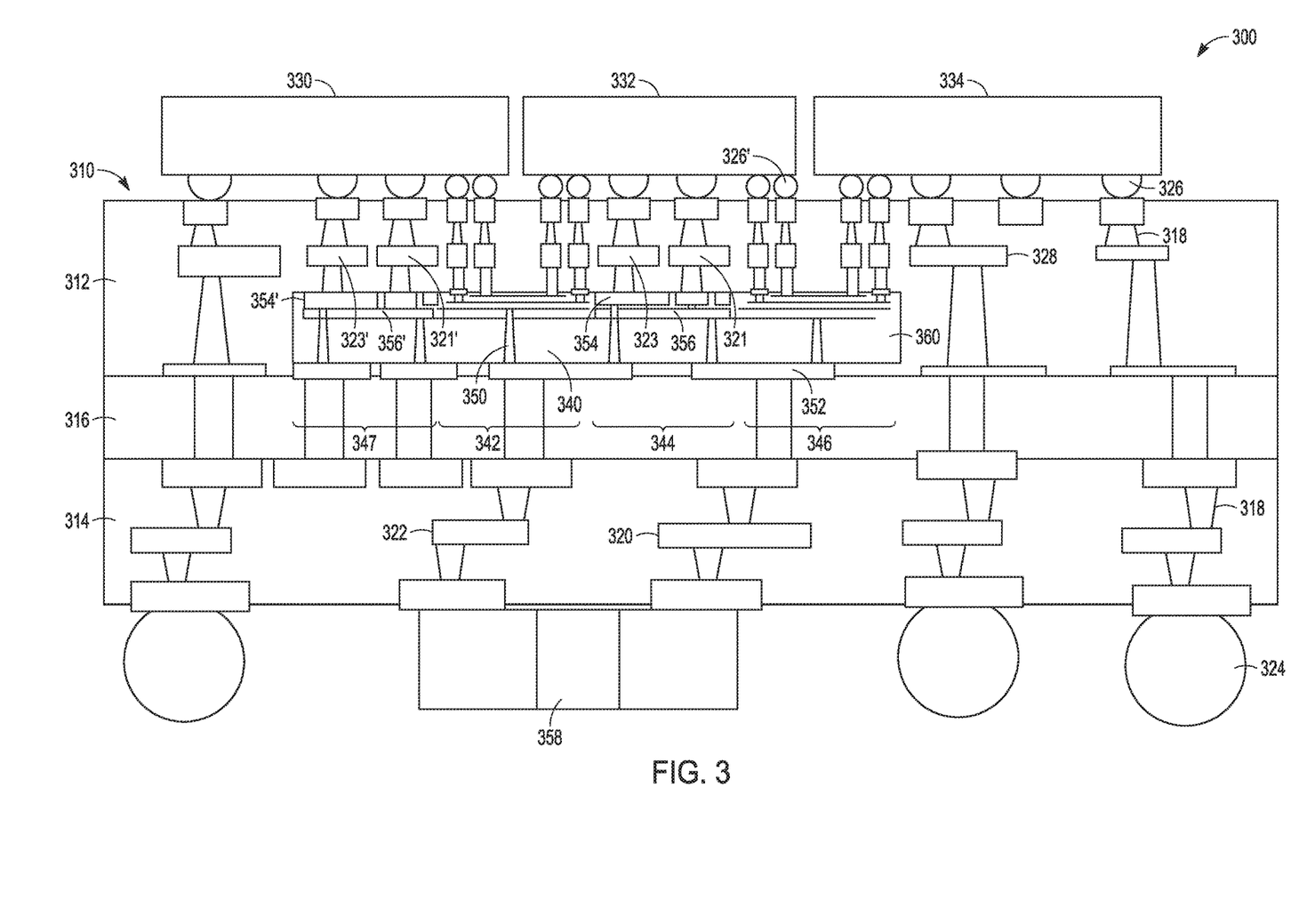
FIG. 3 is a schematic diagram of a multi-chip package with an integrated bridge component including modified electrical traces, in accordance with some example embodiments.

FIG. 3 is a schematic diagram of a multi-chip package 300 with an integrated bridge component 340.

Package 300 can include, for example, substrate 310 with first side 312, second side 314, and core layer 316, via 318, power ($V_{CC}$) trace 320, ground ($V_{ss}$) trace 322, solder ball 324, solder bumps 326, 326', semiconductor dies 330, 332, 334, bridge component 340 with sections 342, 344, 346, 347, landside via 350, landside plane 352, first conductive traces 354, 356, subsequent conductive traces 354', 356', capacitor 358, and bridge substrate material 360. The components in package 300 are similar to the corresponding components in package 100, except where otherwise noted.

In package 300, semiconductor dies 330, 332, 334, can rest on and be coupled to first side 312 of package substrate 310. Dies 330, 332, 334, can be electrically coupled to other components and/or each other through components embedded in package 310, such as via 318, traces 320, 322, signal traces 328 and bridge component 340. Bridge component 340 can include, for example, substrate material 360 defining side sections 342, 346, with middle section 344 in between.

Conductive traces 354, 356 embedded in the bridge component 340, can be parallel each other, and stacked in the middle section 344. In some cases, conductive trace 354 can include a first central ground (Vss) plane 354. In some cases, conductive trace 356 can include a first central power (Vcc) plane 356. First central ground (Vss) plane 354, first central power ($V_{CC}$) plane 356, can be stacked in an alternating fashion within the middle section 344 of the bridge component 340. First central reference planes 354, 356, can be coupled, for example, to second semiconductor die 332, and to other traces, via, or contact pads on or near the bridge component 340. First central reference planes 354, 356 can, for example, have a thickness greater than other reference planes in the bridge component 340, for example, reference planes or traces present inside sections 342, 346, of the bridge component 340. In some cases, first central reference planes 354, 356, are coupled to the reference planes present inside sections 342, 346 of the bridge component 340, for example through landside via 350 and landside plane 352.

Bridge component 340 includes a fourth section 347, and has a larger footprint relative to the bridge components discussed with reference to packages 100, 200. Fourth section 347 of bridge component 340 can include subsequent conductive traces 354', 356', stacked in a subsequent central reference plane section 347. In some cases, subsequent conductive trace 354' can include a subsequent central ground (Vss) plane 354'. In some cases, subsequent conductive trace 356' can include a subsequent central power (Vcc) plane 356'. Subsequent central reference planes 354', 356', can be stacked in an alternating fashion within the fourth section 347 of the bridge component 340. Subsequent central reference planes 354', 356', can be coupled, for example, to first semiconductor die 330, and to other traces, via, or contact pads on or near the bridge component 340. This can allow for additional coupling of power ($V_{CC}$) trace 320, ground ($V_{ss}$) trace 322 or decoupling capacitor to first semiconductor die 330.

Subsequent central reference planes 354', 356' can, for example, have a thickness similar to the first central reference planes 354, 356. In some cases, subsequent central reference planes 354', 356' are coupled to first central reference planes 354, 356, for example through landside via 350, landside plane 352 or section 342.

Landside via 350, landside plane 352, can be embedded in bridge component 340 substrate 360. In bridge component 340, landside via 350 and landside plane 352, can couple the power-ground connections of dies 330, 332, 334, to each other, to power ($V_{CC}$) trace 320, ground ($V_{ss}$) trace 322, other components, or combinations thereof.

Capacitor 358 can be, for example, on surface 314 of package substrate 310, opposite semiconductor dies 330, 332, 334. In some cases, capacitor 358 can be coupled to at least the first central reference planes 354, 356 and the subsequent central reference planes 354', 356' through landside via 318, traces 320, 322, or other planes, for reduced AC loop inductance between capacitor 358 and semiconductor dies 330, 332, 334. In some cases, capacitor 358 can be coupled to reference planes present inside sections 342, 346, of the bridge component 340.

FIGS. 4A-4I are schematic diagrams depicting a method of making a multi-chip package with integrated bridge component.

Figure 4A:
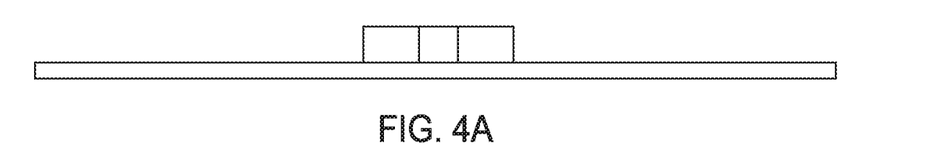
FIGS. 4A-4I are schematic diagrams depicting a method of making a multi-chip package with integrated bridge component, in accordance with some example embodiments.
Figure 4B:
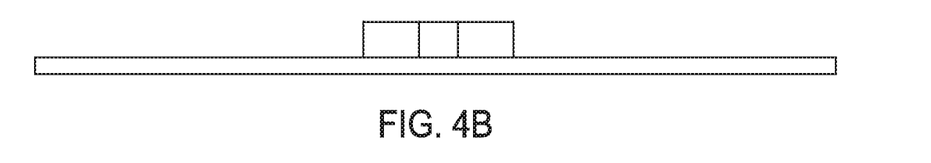

The method begins with attaching a passive component to a carrier material (FIG. 4A). The passive component can be, for example, a decoupling capacitor. Next, a mold layer can be made over the passive component on the carrier (FIG. 4B). The mold layer can include the substrate material for the bridge component that will be constructed. The mold layer can be, for example, injection or compression molded.

Figure 4C:
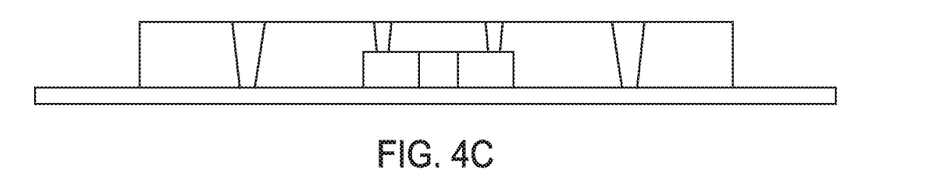

Next, in FIG. 4C, mold openings can be formed in the mold layer. These can be formed for inclusion of via, traces, or other conductive material. The mold openings can be formed, for example, by a laser or mechanical drilling process.

Figure 4D:
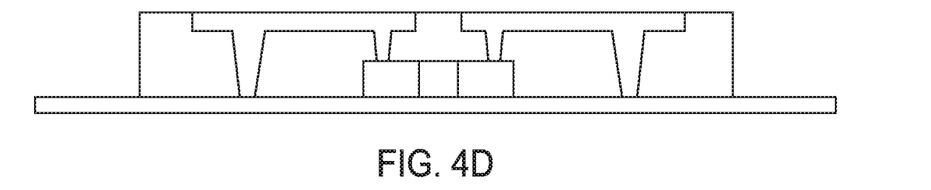

In FIG. 4D, conductive routing can be formed in the openings of the mold layer. This can include via, traces, or other forms of conductive routing that are embedded in the bridge component. The conductive routing can be formed, for example, by electroplating or etching processes. Subsequently, the conductive planes or electrical routing layers of the bridge component can be formed in the various sections of the bridge component, such as by an electroplating or etching process (FIG. 4E).

Figure 4E:
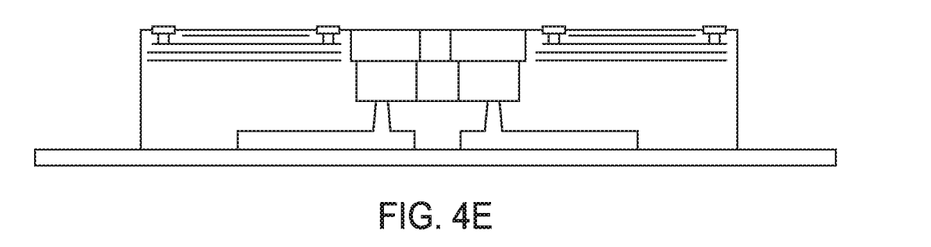
Figure 4F:
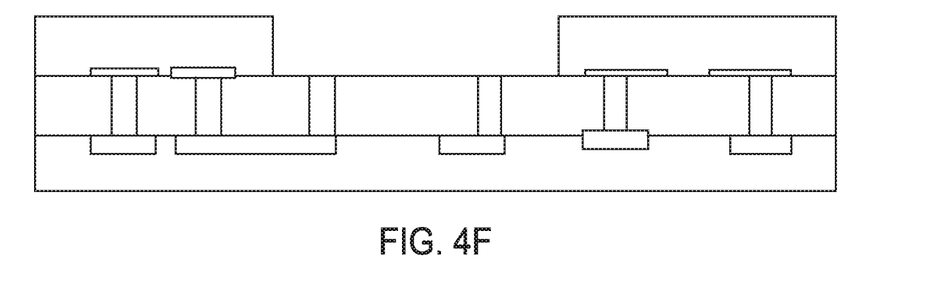

Meanwhile, the semiconductor package substrate can be prepared (FIG. 4F). From a cored package substrate, a cavity and conductive routing can be made in the core (e.g., dielectric) layer, such as via, traces, or other conductive materials. This can be done, for example, by electroplating, etching, drilling, or combinations thereof. In some cases, a coreless substrate can be used.

Figure 4G:
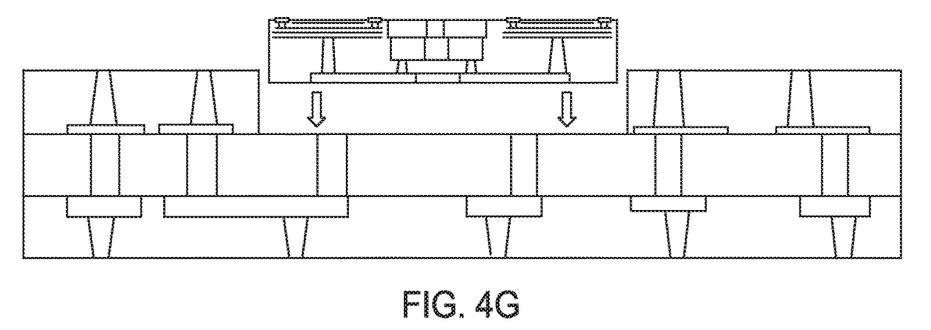

Next, in FIG. 4G, the bridge component from FIG. 4E can be integrated with the semiconductor package substrate. For example, this can be accomplished by inserting the bridge component into the cavity. In some cases, this can be done by a reflow process.

Figure 4H:
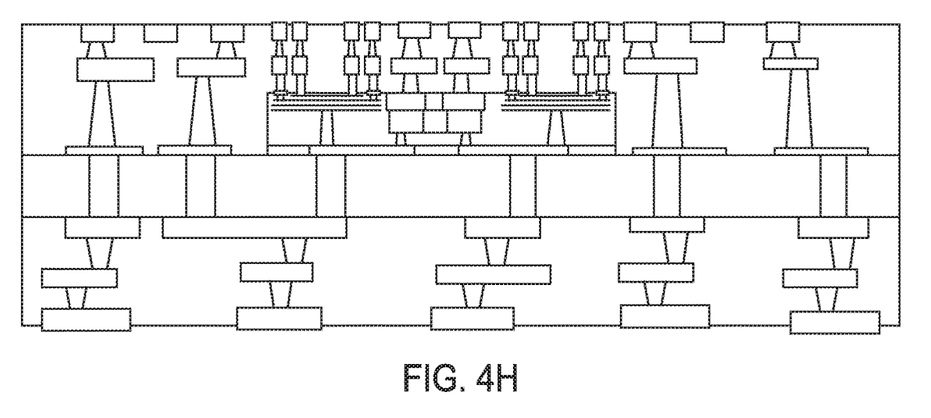

Subsequently, conductive routing and via can be formed on or in the package substrate connecting to the routing in the bridge component (FIG. 4H). This can be done, for example, by electroplating, etching, drilling, or combinations thereof.

Figure 4I:
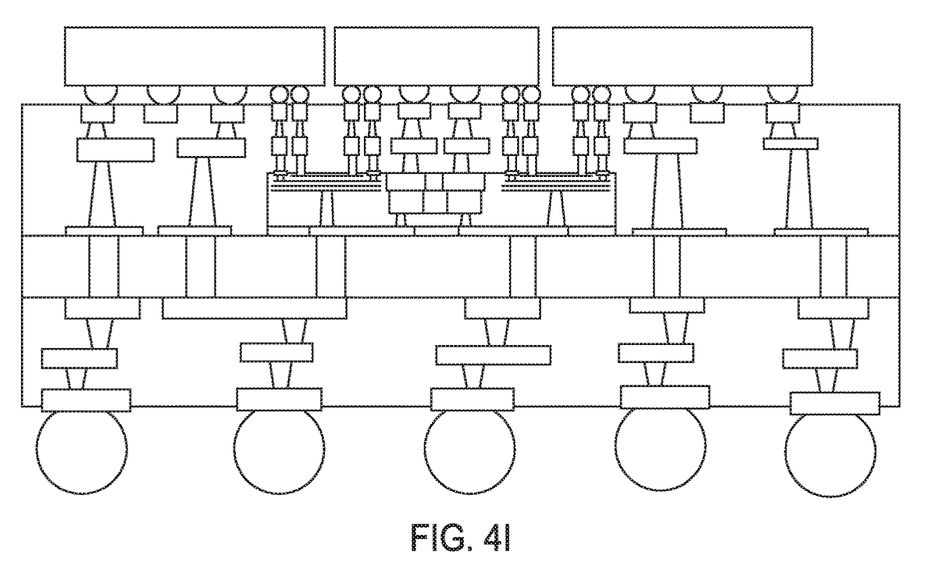

Finally, semiconductor dies can be attached to the package substrate and coupled through the bridge component (FIG. 4I). This can be done, for example, with solder bump connections, by, for example, a reflow process.

Figure 5:
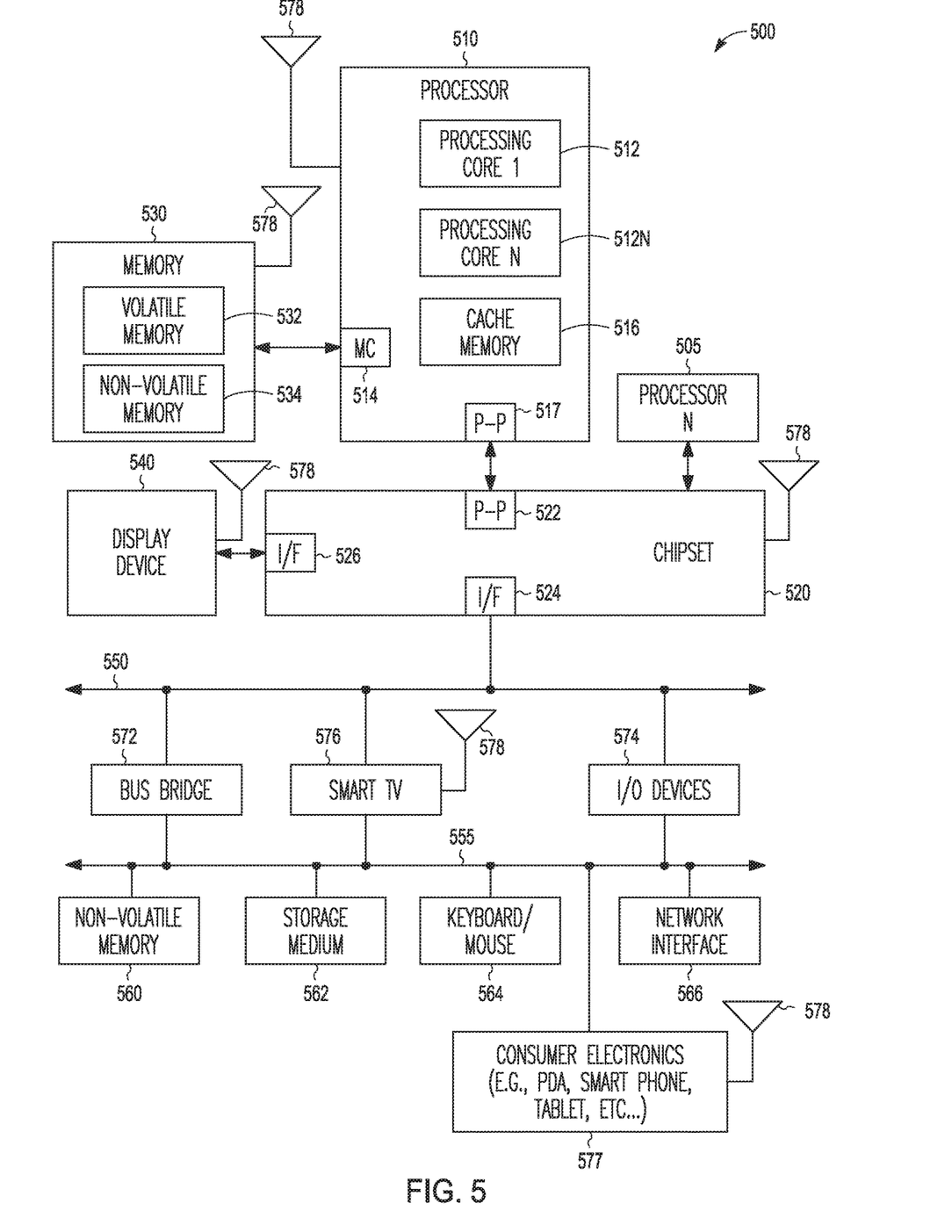
FIG. 5 shows a system that may incorporate a multi-chip package with an integrated bridge component and methods, in accordance with some example embodiments.

FIG. 5 illustrates a system level diagram, depicting an example of an electronic device (e.g., system) including the semiconductor package as described in the present disclosure. FIG. 5 is included to show an example of a higher level device application for semiconductor package with integrated bridge component. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® Quick Path Interconnect (QPI) or the like. In other embodiments, a different interconnect may be used.

In some embodiments, chipset 520 is operable to communicate with processor 510, 505N, display device 540, and other devices, including a bus bridge 572, a smart TV 576, I/O devices 574, non-volatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

To better illustrate the method and apparatuses disclosed herein, a non-limiting list of embodiments is provided here:

Example 1 can include a semiconductor package including a package substrate, a first semiconductor die on the package substrate, a second semiconductor die on the package substrate, a third semiconductor die on the package substrate, and a bridge interconnect at least partially embedded in the package substrate. The bridge interconnect can include a first bridge section coupling the first semiconductor die to the second semiconductor die, a second bridge section coupling the second semiconductor die to the third semiconductor die, and a power-ground section between the first section and the second section, the power-ground section comprising first and second conductive traces coupled to the second semiconductor die.

Example 2 can include Example 1, wherein the first and second conductive traces comprise ground and power traces.

Example 3 can include any of Examples 1-2, further comprising a passive component coupled to the first and second conductive traces.

Example 4 can include any of Examples 1-3, wherein the passive component is embedded in the bridge interconnect.

Example 5 can include any of Examples 1-4, wherein the passive component resides on an external surface of the package substrate.

Example 6 can include any of Examples 1-5, wherein the passive component comprises a capacitor.

Example 7 can include any of Examples 1-6, or wherein the capacitor comprises a silicon capacitor.

Example 8 can include any of Examples 1-7, wherein the capacitor comprises a multi-layer ceramic capacitor.

Example 9 can include any of Examples 1-8, wherein the first bridge section and the second bridge section of the bridge interconnect further comprise traces coupling the first semiconductor die to the second semiconductor die and coupling the second semiconductor die to the third semiconductor die.

Example 10 can include any of Examples 1-9, wherein the bridge interconnect further comprises a second power-ground section comprising third and fourth conductive traces coupled to the first semiconductor die.

Example 11 can include any of Examples 1-10, wherein the second power-ground section is adjacent the first bridge section.

Example 12 can include any of Examples 1-11, wherein the bridge interconnect comprises a lateral cross section at least partially spanning under the first semiconductor die, the second semiconductor die, and the third semiconductor die.

Example 13 can include a bridge component comprising a bridge substrate, and an electrical routing layer thereon. The electrical routing layer can include a first bridge section coupling a first semiconductor die to a second semiconductor die, a second bridge section coupling the second semiconductor die to a third semiconductor die, and a power-ground section between the first section and the second section, the power-ground section comprising first and second conductive traces coupled to the second semiconductor die.

Example 14 can include Example 13, wherein the bridge substrate comprises an organic substrate including a thermoset or thermoplastic resin.

Example 15 can include any of Examples 13-14, wherein the electrical routing layer further comprises one or more metallic layers.

Example 16 can include any of Examples 13-15, wherein the electrical routing layer further comprises at least one ground plane and at least one power plane.

Example 17 can include any of Examples 13-16, further comprising a passive component in the power-ground section and coupled to the electrical routing layer.

Example 18 can include any of Examples 13-17, wherein the passive component is coupled to the electrical louting layer through one or more via.

Example 19 can include a method of making a semiconductor package comprising preparing a package substrate including making a cavity in the package substrate, and inserting conductive routing into the package substrate; making a bridge component comprising molding a layer, and inserting conductive routing thereon; inserting the bridge component into the cavity of the package substrate, attaching one or more semiconductor dies to the package substrate; and electrically coupling the bridge component to the one or more semiconductor dies.

Example 20 can include Example 19, wherein molding a layer comprises molding over a passive component.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor package comprising:
   a package substrate;
   a first semiconductor die on the package substrate;
   a second semiconductor die on the package substrate;
   a third semiconductor die on the package substrate; and
   a bridge interconnect at least partially embedded in the package substrate, the bridge interconnect comprising:
   a first bridge section coupling the first semiconductor die to the second semiconductor die;
   a second bridge section coupling the second semiconductor die to the third semiconductor die; and
   a power-ground section between the first section and the second section, the power-ground section comprising first and second conductive traces coupled to the second semiconductor die.

2. The semiconductor package of claim 1, wherein the first and second conductive traces comprise ground and power traces.

3. The semiconductor package of claim 1, further comprising a passive component coupled to the first and second conductive traces.

4. The semiconductor package of claim 3, wherein the passive component is embedded in the bridge interconnect.

5. The semiconductor package of claim 3, wherein the passive component resides on an external surface of the package substrate.

6. The semiconductor package of claim 3, wherein the passive component comprises a capacitor.

7. The semiconductor package of claim 6, wherein the capacitor comprises a silicon capacitor.

8. The semiconductor package of claim 6, wherein the capacitor comprises a multi-layer ceramic capacitor.

9. The semiconductor package of claim 1, wherein the first bridge section and the second bridge section of the bridge interconnect further comprise traces coupling the first semiconductor die to the second semiconductor die and coupling the second semiconductor die to the third semiconductor die.

10. The semiconductor package of claim 1, wherein the bridge interconnect further comprises a second power-ground section comprising third and fourth conductive traces coupled to the first semiconductor die.

11. The semiconductor package of claim 10, wherein the second power-ground section is adjacent the first bridge section.

12. The semiconductor package of claim 1, wherein the bridge interconnect comprises a lateral cross section at least partially spanning under the first semiconductor die, the second semiconductor die, and the third semiconductor die.

* * * * *